Figure 1:
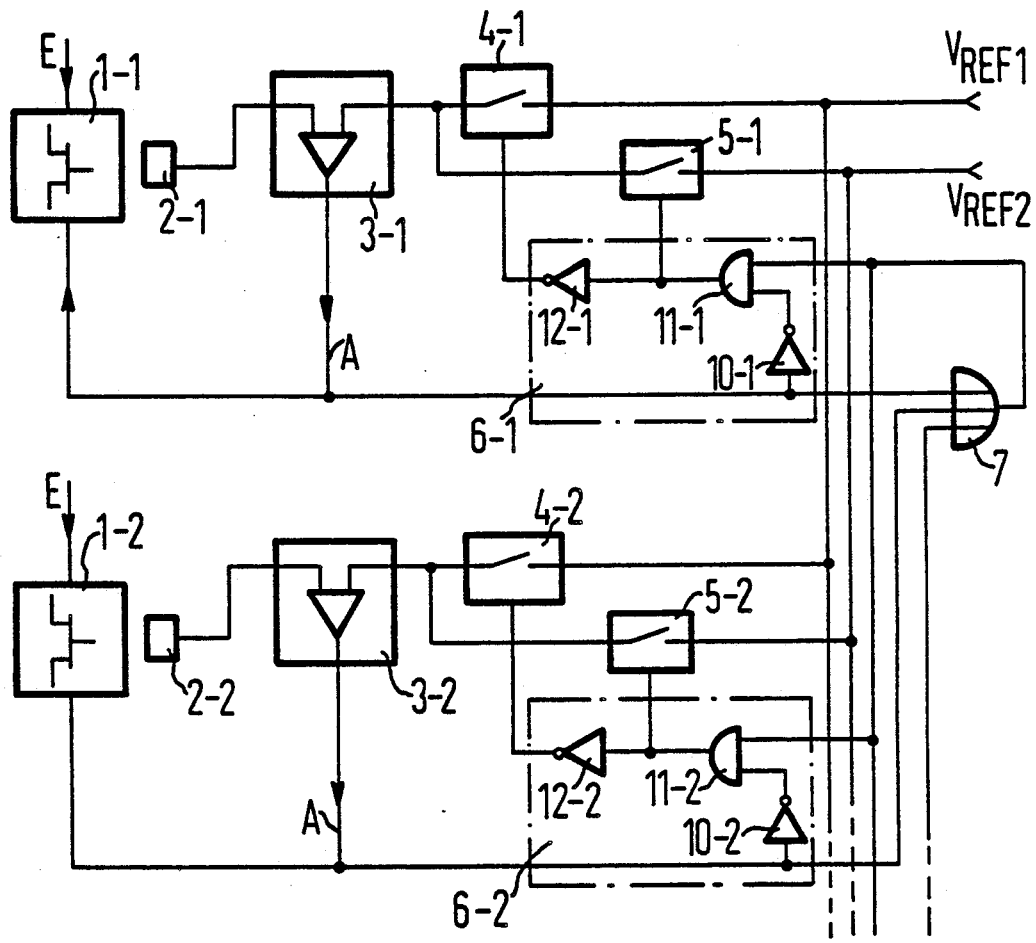

United States Patent [19]
Zitta et al.

[11] Patent Number: 5,001,593
[45] Date of Patent: Mar. 19, 1991

[54] CIRCUIT CONFIGURATION FOR TEMPERATURE MONITORING OF POWER SWITCHING TRANSISTORS INTEGRATED IN A SEMICONDUCTOR CIRCUIT

[75] Inventors: Heinz Zitta, Drobollach; Adam-Istvan Koroncai, Klagenfurt; Johann Massoner, Villach, all of Australia

[73] Assignee: Siemens Aktiengesellschaft, Munich, Fed. Rep. of Germany

[21] Appl. No.: 511,625

[22] Filed: Apr. 20, 1990

[30] Foreign Application Priority Data

Apr. 20, 1989 [EP] European Pat. Off. ........ 89107152.4

[51] Int. Cl.$^5$ ............................................. H02H 5/04
[52] U.S. Cl. ...................................... 361/103; 361/93; 323/907
[58] Field of Search ................... 361/103, 56, 106, 93; 323/907; 307/117

[56] References Cited
U.S. PATENT DOCUMENTS 4,345,218  8/1982  Congdon et al. ................ 361/103
4,821,136  4/1989  Murari et al. .................... 361/58
4,887,181  12/1989 Lenz ................................. 361/103
4,910,631  3/1990  Murphy ............................ 361/96

OTHER PUBLICATIONS

Publication "The Am7938 Quad Exchange Power Controller (QEPC)", pp. 5-1 through 5-17.

Primary Examiner—Todd E. Deboer
Attorney, Agent, or Firm—Herbert L. Lerner; Laurence A. Greenberg

[57] ABSTRACT

A circuit configuration for monitoring the temperature of power switching transistor integrated in a semiconductor circuit for overload protection includes temperature sensors each being associated with one respective power switching transistor for detecting the circuit temperature and issuing an output signal. Comparison stages are each connected to a respective one of the temperature sensors for comparing the output signal of one of the temperature sensors with a first reference corresponding to a first predetermined temperature value and switching off only the power switching transistor associated therewith upon attainment of the first predetermined temperature value. Logic elements are each connected to a respective one of the comparison for switching over the comparison stages associated with all of the other power switching transistors from the first reference corresponding to the first predetermined temperature value to a second reference corresponding to a second predetermined temperature value being higher than the first predetermined temperature value, upon attainment of the first predetermined temperature value at, and the shutoff of, a power switching transistor.

7 Claims, 1 Drawing Sheet

CIRCUIT CONFIGURATION FOR TEMPERATURE MONITORING OF POWER SWITCHING TRANSISTORS INTEGRATED IN A SEMICONDUCTOR CIRCUIT

The invention relates to a circuit configuration for monitoring the temperature of power switching transistors integrated in a semiconductor circuit for overload protection, in which the circuit temperature is detected by means of at least one temperature sensor and a switching transistor shutoff is effected when a predetermined temperature value is exceeded An example of an integrated circuit with a plurality of integrated power switching transistors in a single system is an integrated power regulator, which is specially constructed to supply two and four-wire transmission lines in telephone switching systems. The individual power supply and regulation are each performed through one power switching transistor, so that up to four such transistors are integrated in one system.

In an integrated circuit of that kind, the power switching transistors must be protected against thermal overload, and must be switched off if a predetermined temperature is exceeded in the switching circuit system.

To this end, it is known to generate a shutoff signal upon attaining a predetermined temperature of the circuit system, and to switch off all of the power switching transistors, regardless of which power switching transistor was responsible for the temperature increase and therefore the thermal overload. However, that is not always necessary, because it would be sufficient to merely switch off the power switching transistor, and the line supplied by it, that was responsible for the thermal overload. Such a provision is achieved, for instance, in an American Micro Devices integrated circuit, type Am 7938.

It is accordingly an object of the invention to provide a circuit configuration for temperature monitoring of power switching transistors integrated in a semiconductor circuit, which overcomes the hereinafore-mentioned disadvantages of the heretofore-known devices of this general type, and with which it is possible to switch off only the power switching transistor or transistors responsible for the temperature overload, and to keep all of the other power switching transistors on, even if the entire circuit system has assumed the increased temperature beyond the point at which the temperature increase initially occurred.

With the foregoing and other objects in view there is provided, in accordance with the invention, a circuit configuration for monitoring the temperature of power switching transistors integrated in a semiconductor circuit for overload protection, comprising temperature sensors each being associated with one respective power switching transistor for detecting the circuit temperature and issuing an output signal, comparison stages each being connected to a respective one of the temperature sensors for comparing the output signal of one of the temperature sensors with a first reference corresponding to a first predetermined temperature value and switching off only the power switching transistor associated therewith upon attainment of the first predetermined temperature value, and logic elements each being connected to a respective one of the comparison stages for switching over the comparison stages associated with all of the other power switching transistors from the first reference corresponding to the first predetermined temperature value to a second reference corresponding to a second predetermined temperature value being higher than the first predetermined temperature value, upon attainment of the first predetermined temperature value at, and the shutoff of, a power switching transistor.

In accordance with another feature of the invention, the temperature sensors are transistor stages connected to a third reference and connected as emitter followers.

In accordance with a further feature of the invention, there is provided an OR gate having inputs and an output, each of the comparison stages having an input and having an output connected to a respective one of the inputs of the OR gate, and each of the logic elements being a gate stage connected to the input of a respective one of the comparison stages and associated with a respective one of the power switching transistor, each of the gate stages including a first inverter having an output, an AND gate having two inputs and an output, one of the inputs of the AND gate being connected to the output of the first inverter and the other of the inputs of the AND gate being connected to the output of the OR gate, and a second inverter having an output and having an input connected to the output of the AND gate.

In accordance with a concomitant feature of the invention, there are provided first toggles each being connected to the output of the second inverter of a respective one of the gate stages for coupling the first reference to a respective one of the comparison stages, and second toggles each being connected to the output of the AND gate of a respective one of the gate stages for coupling the second reference to a respective one of the comparison stages.

Other features which are considered as characteristic for the invention are set forth in the appended claims.

Although the invention is illustrated and described herein as embodied in a circuit configuration for temperature monitoring of power switching transistors integrated in a semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
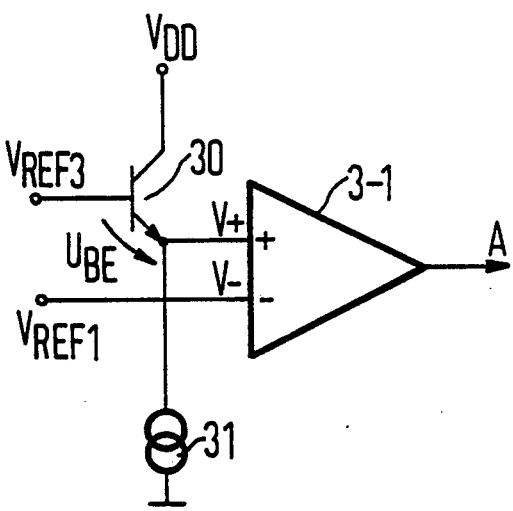

FIG. 1 is a schematic and block circuit diagram of an embodiment of a circuit configuration according to the invention; and FIG. 2 is a portion of circuit diagram showing a temperature sensor in the form of an emitter follower transistor stage, with a comparison stage connected to the output side thereof.

Referring now to the figures of the drawing in detail and first, particularly, to FIG. 1 thereof, there is seen a circuit configuration having power switching transistors 1-1 and 1-2 which can be made conducting by a turn-on signal E, which are elements to be protected against thermal overload and which have a temperature to be monitored. It should be noted that in FIG. 1, only two power switching transistors have been schematically shown. In a practical embodiment, a greater number of power switching transistors, for instance approximately four such elements, may be be provided, if an integrated circuit in the form of a power regulator for a four-wire line of a telephone switching system is involved, as discussed above. The same applies for the other components of the circuit configuration of FIG. 1 to be described hereinbelow.

It should also be noted that the integrated circuit may be made by bipolar, MOS or BICMOS technology. Therefore the power switching transistors 1-1, 1-2 may also be bipolar or MOS transistors.

Each transistor 1-1, 1-2 is assigned its own temperature sensor 2-1, 2-2 closely adjoining it, and in accordance with a special embodiment of FIG. 2, each temperature sensor may be a transistor stage wired as an emitter follower and connected by its base to a (third) reference $V_{REF3}$.

The temperature sensors 2-1, 2-2 are each connected to an input of a respective comparison stage 3-1, 3-2, which are connected by a further input to a first reference $V_{REF1}$. The comparison stages 3-1, 3-2 may be formed in a known manner by an operational amplifier stage. The reference $V_{REF1}$ is equivalent to a first predetermined temperature value, for instance 130° C. The reference $V_{REF1}$ is carried to the comparison stages 3-1, 3-2 through respective first toggles 4-1, 4-2.

The output of each respective comparison stage 3-1, 3-2 is fed on one hand to the respective power switching transistor 1-1, 1-2, and on the other to a logic element, which is in the form of a respective gate stage 6-1, 6-2, as well as to a common OR gate 7. The gate stages 6-1, 6-2 in turn each include an inverter 10-1, 10-2, which is connected with the input thereof at the output of the respective comparison stage 3-1, 3 2, and with the output thereof at an input of an AND gate 11-1, 11-2. A further input of each respective AND gate 11-1, 11-2 is connected to the output of the OR gate 7. The output of each respective AND gate 11-1, 11-2 is fed to the input of a further inverter 12-1, 12-2, having the output thereof being fed to the respective toggle 4-1, 4-2, in order to switch it over as a function of the output signal of the further inverter. Finally, the output of the respective AND gate 11-1, 11-2 is also connected to a further toggle 5-1, 5-2, through which a second reference $V_{REF2}$, corresponding to a second predetermined temperature, is carried to the inputs of the comparison stages 3-1, 3-2, to which the first reference $V_{REF1}$ is also carried.

The second reference $V_{REF2}$ is equivalent to a second predetermined temperature value that is higher than the first and, for instance, equals 150° C.

The operation of the above-described circuit configuration is as follows:

First, it is assumed that no thermal overload of the power switching transistors 1-1, 1-2 is present, and the temperature of the circuit system is below the first predetermined temperature that is equivalent to the first reference $V_{REF1}$. The voltage supplied by the temperature sensors 2-1, 2-2 is therefore below the reference voltage $V_{REF1}$, and the transistors 1-1, 1-2 are made conducting.

It may then be assumed that the power switching transistor 1-1, for instance, becomes overloaded, causing a temperature increase in the integrated circuit system in the vicinity thereof. The temperature increase is detected by the temperature sensor 2-1 and is fed as an input signal to the comparison stage 3-1. If the voltage at the temperature sensor 2-1 exceeds the first reference voltage $V_{REF1}$, then the comparison stage 3-1 switches over and furnishes an output signal A, which is supplied as a shutoff signal to the power switching transistor 1-I, so that this element is switched off. Accordingly, an essential characteristic of the invention is that only the power switching transistor having a temperature increase caused by overloading, is shutoff.

The operation of the logic element formed of the gate stages 6-1, 6-2 and the OR gate 7 will now be described. First, it is again assumed that no thermal overload is present in the integrated circuit. Accordingly, the comparison stages 3-1, 3-2 have not switched over, and therefore no shutoff signal A is present. The signal present at the outputs of the comparison stages 3-1, 3-2 can accordingly be interpreted as a signal having a low level. This low-level signal is fed into the input of the inverters 10-1, 10-2 in the gate stages 6-1, 6-2, and each is fed into one input of the OR gate 7. As a result of the inverting action of the respective inverter 10-1, 10-2, this low-level signal is fed in the form of a signal having a high level, into one input of the respective AND gate 11-1, 11-2, while it is fed through the OR gate 7 in the form of a signal having a low level into the further input of the respective AND gate 11-1, 11-2. The AND gates 11-1, 11-2 then likewise furnish a low-level signal, which is fed as a signal having a high level to the toggles 4-1, 4-2, as a result of the action of the respective further inverters 12-1, 12-2 in the gate stages 6-1, 6-2. The further toggles 5-1, 5-2 receive the signal having a low level at the output of the AND gates 11-1, 11-2. With this signal configuration, the toggles 4-1, 4-2 are switched over in such a way that the first reference $V_{REF1}$ is coupled to the comparison stages 3-1, 3-2. Since the toggles 5-1, 5-2 receive a signal having a low level from the output of the AND gates 11-1, 11-2, the second reference $V_{REF2}$ remains switched off by the comparison stages 3-1, 3-2

If a comparison stage, for instance the comparison stage 3-1 as described above, furnishes a shutoff signal A, which can be interpreted as a signal having a high level, then the signal levels at the two inputs of the associated AND gate 11-1 revert, so that the signal levels at the output of the AND gate 11-1 and at the output of the inverter 12-1 remain unchanged. In other words, the first reference $V_{REF1}$ continues to be coupled to the comparison stage 3-1 through the toggle 4-1.

However, in the gate stage 6-2, signal level conditions then arise in such a way that the first reference $V_{REF1}$ is uncoupled from the comparison stage 3-2 due to the switchover of the toggle 4-2, and the second reference $V_{REF2}$ is coupled to the comparison stage 3-2 through the toggle 5-2. Since the power switching transistor 1-2 is in fact assumed not to be thermally overloaded, a signal having a low level remains at the output of the comparison stage 3-2 and is fed as a signal having a high level into the one input of the AND gate 11-2 through the inverter 10-2. However, as already explained above, because of the switchover of the comparison stage 3-1, a signal having a high level is present at the output of the OR gate 7 and therefore at the other input of the AND gate 11-2, so that a signal having a high level is then present at the output of the AND gate 11-2 and correspondingly a signal having a low level is present at the output of the inverter 12-2, resulting in the aforementioned switching positions of the toggles 4-2 and 5-2. Thus, even if the increased temperature dictated by the thermal overload of the power switching transistor 1-1, corresponding to the first reference $V_{REF1}$, has extended over the entire circuit system, nevertheless the other power switching transistors remain switched on, as long as the higher temperature defined by the second reference $V_{REF2}$ has not been attained. Since the thermal time constant of the system is greater than the electrical switchover time constant in any case, this assures the switching conditions explained above in every case.

In accordance with FIG. 2, the temperature sensors 2-1, 2-2 of FIG. 1 can each be in the form of a transistor stage 30 which is connected as an emitter follower, having a current source 31 located in its emitter branch and being supplied by a supply voltage $V_{DD}$. The base of this transistor stage is supplied with a third reference voltage $V_{REF3}$. Its base-to-emitter voltage $U_{BE}$ represents the temperature-dependent voltage that is fed, as a voltage V+, into the non-inverting input of a comparison stage, for instance the comparison stage 3-1 of FIG. 1. The first reference voltage $V_{REF1}$ (or the second reference voltage $V_{REF2}$) is fed into the inverting input as a voltage V−.

If the temperature is initially still below the temperature defined by the first reference $V_{REF1}$, then the voltage V+ is lower than the voltage V−, so that the signal A having a low level is present at the output of the comparison stage 3-1.

If the temperature rises, then the base-to-emitter voltage $U_{BE}$ of the transistor 30 drops and thus the voltage V+ rises, until a state is attained above the reference $V_{REF1}$ at which the voltage V+ is greater than the voltage V−, so that the comparison stage 3-1 switches over, and the signal A assumes a high level.

We claim:

1. Circuit configuration for monitoring the temperature of power switching transistors integrated in a semiconductor circuit for overload protection, comprising
   temperature sensors each being associated with one respective power switching transistor for detecting the circuit temperature and issuing an output signal,
   comparison stages each being connected to a respective one of said temperature sensors for comparing said output signal of one of said temperature sensors with a first reference corresponding to a first predetermined temperature value and switching off only the power switching transistor associated therewith upon attainment of the first predetermined temperature value, and
   logic elements each being connected to a respective one of said comparison stages for switching over said comparison stages associated with all of the other power switching transistors from the first reference corresponding to the first predetermined temperature value to a second reference corresponding to a second predetermined temperature value being higher than the first predetermined temperature value, upon attainment of the first predetermined temperature value at, and the shutoff of, a power switching transistor.

2. Circuit configuration according to claim 1, wherein said temperature sensors are transistor stages connected to a third reference and connected as emitter followers.

3. Circuit configuration according to claim 1, including an OR gate having inputs and an output, each of said comparison stages having an input and having an output connected to a respective one of the inputs of said OR gate, and each of said logic elements being a gate stage connected to the input of a respective one of said comparison stages and associated with a respective one of the power switching transistor, each of said gate stages including a first inverter having an output, an AND gate having two inputs and an output, one of the inputs of said AND gate being connected to the output of said first inverter and the other of the inputs of said AND gate being connected to the output of said OR gate, and a second inverter having an output and having an input connected to the output of said AND gate.

4. Circuit configuration according to claim 2, including an OR gate having inputs and an output, each of said comparison stages having an input and having an output connected to a respective one of the inputs of said OR gate, and each of said logic elements being a gate stage connected to the input of a respective one of said comparison stages and associated with a respective one of the power switching transistor, each of said gate stages including a first inverter having an output, an AND gate having two inputs and an output, one of the inputs of said AND gate being connected to the output of said first inverter and the other of the inputs of said AND gate being connected to the output of said OR gate, and a second inverter having an output and having an input connected to the output of said AND gate.

5. Circuit configuration according to claim 3, including first toggles each being connected to the output of said second inverter of a respective one of said gate stages for coupling the first reference to a respective one of said comparison stages, and second toggles each being connected to the output of said AND gate of a respective one of said gate stages for coupling the second reference to a respective one of said comparison stages.

6. Circuit configuration according to claim 4, including first toggles each being connected to the output of said second inverter of a respective one of said gate stages for coupling the first reference to a respective one of said comparison stages, and second toggles each being connected to the output of said AND gate of a respective one of said gate stages for coupling the second reference to a respective one of said comparison stages.

7. Semiconductor circuit, comprising integrated power switching transistors, and a circuit configuration for monitoring the temperature of the power switching transistors for overload protection, the circuit configuration including
   temperature sensors each being associated with a respective one of said power switching transistor for detecting the circuit temperature and issuing an output signal,
   comparison stages each being connected to a respective one of said temperature sensors for comparing said output signal of one of said temperature sensors with a first reference corresponding to a first predetermined temperature value and switching off only said power switching transistor associated therewith upon attainment of the first predetermined temperature value, and
   logic elements each being connected to a respective one of said comparison stages for switching over said comparison stages associated with all of the other of said power switching transistors from the first reference corresponding to the first predetermined temperature value to a second reference corresponding to a second predetermined temperature value being higher than the first predetermined temperature value, upon attainment of the first predetermined temperature value at, and the shutoff of, one of said power switching transistors.

* * * * *